(12) United States Patent
Narita et al.

(10) Patent No.: US 7,952,365 B2
(45) Date of Patent: May 31, 2011

(54) RESONATOR, PRINTED BOARD, AND METHOD FOR MEASURING COMPLEX DIELECTRIC CONSTANT

(75) Inventors: Kaoru Narita, Tokyo (JP); Taras Kushta, Tokyo (JP)

(73) Assignee: NEC Corporation, Tokyo (JP)

( * ) Notice: Subject to any disclaimer, the term of this patent is extended or adjusted under 35 U.S.C. 154(b) by 659 days.

(21) Appl. No.: 11/817,280

(22) PCT Filed: Mar. 22, 2006

(86) PCT No.: PCT/JP2006/305745
§ 371 (c)(1),
(2), (4) Date: Nov. 15, 2007

(87) PCT Pub. No.: WO2006/101145
PCT Pub. Date: Sep. 28, 2006

(65) Prior Publication Data
US 2009/0015266 A1    Jan. 15, 2009

(30) Foreign Application Priority Data

Mar. 23, 2005   (JP) ................................ 2005-084549

(51) Int. Cl.
*G01R 27/04*   (2006.01)
*G01R 27/28*   (2006.01)
*G01J 3/00*    (2006.01)
(52) U.S. Cl. ........... 324/633; 324/636; 324/652; 356/51
(58) Field of Classification Search .................. 324/633, 324/636, 652; 714/721, 745; 356/51
See application file for complete search history.

(56) References Cited

U.S. PATENT DOCUMENTS

| | | | | |
|---|---|---|---|---|
| 6,320,401 | B1 * | 11/2001 | Sugimoto et al. | 324/765 |
| 6,873,162 | B1 * | 3/2005 | Bois et al. | 324/638 |
| 2002/0180004 | A1 * | 12/2002 | Oggioni et al. | 257/621 |

FOREIGN PATENT DOCUMENTS

| | | |
|---|---|---|
| JP | 6-74974 U | 10/1994 |
| JP | 6-77312 U | 10/1994 |
| JP | 6-331670 A | 12/1994 |
| JP | 7-140186 A | 6/1995 |
| JP | 8-20481 B2 | 3/1996 |
| JP | 8-220160 A | 8/1996 |
| JP | 10-051235 * | 2/1998 |
| JP | 10-51235 A | 2/1998 |

(Continued)

*Primary Examiner* — Timothy J Dole
*Assistant Examiner* — Farhana Hoque
(74) *Attorney, Agent, or Firm* — Sughrue Mion, PLLC

(57) ABSTRACT

A plurality of through-hole vias connected to conductor layers is disposed with gaps left between these vias around opening parts disposed in the conductor layers in a printed board in which these conductor layers are disposed parallel to each other so as to sandwich a dielectric layer in between. Furthermore, through-hole vias used for excitation are disposed in the opening parts of the conductor layers and regions of the dielectric layer matching these opening parts in a non-contact manner with the conductor layers. When the complex dielectric constant is measured, a high-frequency power is applied to the through-hole vias, and the power loss between the through-hole vias and the conductor layers is measured by the S parameter method. As a result, the complex dielectric constant and the frequency dependency of this complex dielectric constant can be measured with a high precision in a frequency range extending from several gigahertzes to 20 GHz, and there is no electrical interference with other parts even when this resonator is mounted on a board.

13 Claims, 7 Drawing Sheets

FOREIGN PATENT DOCUMENTS

| | | | |
|---|---|---|---|
| JP | 10-51236 A | 2/1998 |
| JP | 1051236 * | 2/1998 |
| JP | 2000-183233 A | 6/2000 |
| JP | 2003-168761 A | 6/2003 |
| JP | 2003-309403 A | 10/2003 |
| JP | 2003-331220 A | 11/2003 |
| JP | 2004-45262 A | 2/2004 |
| JP | 2004-177234 A | 6/2004 |

* cited by examiner

RESONATOR, PRINTED BOARD, AND METHOD FOR MEASURING COMPLEX DIELECTRIC CONSTANT

TECHNICAL FIELD

The present invention relates to a resonator which is used to measure the complex dielectric constant of a dielectric and the frequency characteristics of this dielectric constant, a printed board on which this resonator is mounted, and a method for measuring a complex dielectric constant using this resonator.

BACKGROUND ART

The complex dielectric constant of the material constituting a printed board, and the frequency dependency of this dielectric constant are related to the attenuation and delay of signals that are propagated through transmission paths formed inside the printed board, and are also used in the circuit simulation required in the design of high-speed transmission paths. Accordingly, the high-precision measurement of the complex dielectric of materials constituting printed boards is extremely important for increasing the precision of circuit simulations during design, and for improving the design precision.

Conventionally, for example, the complex dielectric constants of materials constituting printed boards, and the frequency characteristics of these dielectric constants, have been determined by forming a strip line resonator by sandwiching a strip conductor between layered plates comprising the material that is to be measured such as a dielectric material or the like, which forms the insulating layer of the printed board (for example, see patent document 1 or patent document 2), and obtaining the Q value of the resonance by measuring the frequency characteristics of the S parameter. Alternatively, there is also a method in which the material that is to be measured is cut out, mounted in a special tool, and measured (for example, see patent documents 3 through 8).

Moreover, a method has also been proposed in which a high-frequency circuit structure that can be used to measure the complex dielectric constant inside a printed board is constructed (for example, see patent documents 9 through 13). FIG. 9 is a schematic sectional view showing the construction of the high-frequency circuit described in patent document 10. In the high-frequency circuit 100 described in patent document 10, as is shown in FIG. 9, a plurality of conductor layers is stacked via insulating layers, and a circuit pattern 121 in which various types of parts are attached is formed on the surface.

Furthermore, an internal electrode 122 containing passive circuits such as a matching line, choke line, and the like is formed beneath the circuit pattern 121 via an insulating layer 111, and the ground electrode 123 of the strip-line resonator constituting a high-frequency circuit is formed beneath this via an insulating layer 112. Furthermore, a central conductor 124 of the strip-line resonator is formed beneath the ground electrode 123 via an insulating layer 113, and the ground electrode 125 of the strip-line resonator is formed beneath this via an insulating layer 114. Furthermore, an insulating layer 115 is formed as the lowermost layer, and a side-surface electrode 126 is formed so as to cover the side surface of this layered assembly. Moreover, through-holes are formed in the internal parts of the respective insulating layers, and conductor layers are formed on the inside surfaces of these through-holes, so that the circuit pattern 121 and central conductor 124 are appropriately connected.

In this high-frequency circuit 100, the pattern of the ground electrode 123 is formed with a shape which is such that no electrode is formed in the area corresponding to the shape of the central conductor 124, thus lowering the capacitance between the ground electrode 123 and central conductor 124, and improving the Q value of the strip-line resonator.

Patent Document 1: Japanese Laid-Open Utility Model Application No. 6-74974
Patent Document 2: Japanese Laid-Open Utility Model Application No. 6-77312
Patent Document 3: Japanese Laid-Open Patent Application No. 6-331670
Patent Document 4: Japanese Patent Publication No. 8-20481
Patent Document 5: Japanese Laid-Open Patent Application No. 7-140186
Patent Document 6: Japanese Laid-Open Patent Application No. 8-220160
Patent Document 7: Japanese Laid-Open Patent Application No. 2003-331220
Patent Document 8: Japanese Laid-Open Patent Application No. 2004-45262
Patent Document 9: Japanese Laid-Open Patent Application No. 10-51235
Patent Document 10: Japanese Laid-Open Patent Application No. 10-51236
Patent Document 11: Japanese Laid-Open Patent Application No. 2000-183233
Patent Document 12: Japanese Laid-Open Patent Application No. 2003-168761
Patent Document 13: Japanese Laid-Open Patent Application No. 2003-309403

DISCLOSURE OF THE INVENTION

Problems the Invention is Intended to Solve

However, the following problems have been encountered in the prior art described above. In actual printed boards, especially printed boards having a multi-layer structure, a plurality of materials such as a board, prepreg, layered material, and the like is layered, and a heat treatment and/or pressing treatment is performed after these materials are layered in the manufacturing process. As a result, the effective complex dielectric constant of the printed board depends on the layer construction and manufacturing process, and even if the complex dielectric constant of a sample cut out from the board or a sample cut out from a specified location following layering is measured, this may not always reflect the parameters of the printed board as a whole. Accordingly, in cases in which a sample is cut out from a portion of the printed board, and the complex dielectric constant is measured using a special tool, as in the measurement methods described in patent documents 1 through 8, the effective complex dielectric constant of the printed board as a whole cannot be measured with good precision.

On the other hand, if the complex dielectric constant is measured using a resonator installed inside the printed board, the complex dielectric constant of the printed board as a whole can be measured. However, the following problems arise: as is shown, for example, in FIG. 9, the resonator described in patent documents 9 through 13 has an independent structure surrounded by the side-surface electrode 126. Consequently, it is difficult to build other parts into the interior portion of the printed board as test patterns. Furthermore, since the resonator is not excited, it is difficult to measure the complex dielectric constant with high precision in a high frequency range extending from several gigahertzes to about 20 GHz.

The present invention was devised in the light of such problems. It is an object of the present invention to provide a resonator which can measure the complex dielectric constant and the frequency dependency of this dielectric constant with good precision in a frequency range extending from several gigahertzes to 20 GHz, and which shows no electrical interference with other parts even when mounted on a board, and also to provide a printed board and a method for measuring the complex dielectric constant.

Means Used to Solve the Above-Mentioned Problems

The resonator of a first aspect of the present invention is a resonator for measuring a complex dielectric constant which measures the complex dielectric constant of a dielectric layer and which is characterized in comprising:

first and second conductor layers disposed parallel to each other so as to sandwich the dielectric layer in between;

first and second opening parts that face each other and are formed in the first and second conductor layers, respectively;

a plurality of first vias which is disposed with gaps left in between around the first and second opening parts, and which connect the first and second conductor layers to each other; and second vias formed without being in contact with the first and second conductor layers in the first and second opening parts and in regions of the dielectric layer that match these opening parts.

In this aspect of the present invention, a parallel flat-plate resonator is formed by the first vias and the first and second conductor layers, and this resonator can be excited by the application of high-frequency electric power to the second vias used for excitation which are formed in a non-contact manner with the first and second conductor layers. Accordingly, there is no need to use a special tool when the complex dielectric constant is measured; furthermore, since a side-surface electrode is unnecessary as in a conventional resonator, some of the area of the printed board can be utilized and built in as a test coupon of the actual device. Furthermore, in this resonator, since a side wall is formed by the plurality of first vias, there is no electrical interference with other parts even if the resonator is mounted on a board. Accordingly, the effective complex dielectric constant of the actual printed board for which a measurement is desired can be measured with high precision. As a result, the parameters required for the design of the printed board can be measured with high precision, and the design precision can be markedly improved.

Furthermore, this resonator may have one or more conductor layers which are disposed parallel to the first and second conductor layers so as to sandwich the dielectric layer between the first and second conductor layers, which have opening parts formed in positions matching the first and second opening parts, and which are connected to the first vias. The present invention can thereby be applied to a printed board with a multi-layer structure in which three or more conductor layers are layered on both sides of a dielectric layer in order to be able to form a plurality of resonators.

Furthermore, the region surrounded by the first vias may be rectangular as seen in a plan view. As a result, for example, in cases in which the measurement frequency range is up to 20 GHz, the size can be reduced to about 20 mm on one side. In cases in which the measurement frequency range exceeds 20 GHz, the size can be reduced even further. In this case, furthermore, the length of one side of the rectangular regions can be set at $(\lambda/\sqrt{2})$, where $\lambda$ is the measurement wavelength of the complex dielectric constant. As a result, a resonance peak of 1 or greater is generated in the power loss between the second vias and the first and second conductor layers.

Furthermore, the distance between adjacent first vias may be set at $(\lambda/20)$ or less, where $\lambda$ is the measurement wavelength of the complex dielectric constant. As a result, the power leaks occurring between adjacent first vias can be minimized.

The printed board of a second aspect of the present invention is a printed board in which a plurality of conductor layers is insulated by dielectric layers, wherein the printed board has the resonator described above.

In this aspect of the present invention, a flat-plate resonator is formed by the plurality of first vias and first and second conductor layers, and this resonator is excited by the application of high-frequency power to the first and second opening parts and second vias formed without being in contact with the first and second conductor layers in the first and second opening parts and in regions of the dielectric layer that match these opening parts. Accordingly, the complex dielectric constant of the dielectric layers can be measured with a high precision even if a special tool is not used. Furthermore, since this resonator is surrounded by a plurality of first vias, there is no electrical interference with other parts mounted in the printed board.

The method for measuring a complex dielectric constant according to a third aspect of the present invention is a method for measuring the complex dielectric constant of a dielectric layer. Said method for measuring the complex dielectric constant of a dielectric layer comprises the steps of:

applying a high-frequency electric power to the second vias of a resonator, said resonator having first and second conductor layers disposed parallel to each other so as to sandwich said dielectric layer in between, first and second opening parts that face each other and are formed in said first and second conductor layers, respectively, a plurality of first vias which is disposed with gaps left in between around said first and second opening parts, and which connect said first and second conductor layers to each other, and second vias formed without being in contact with said first and second conductor layers in said first and second opening parts and in regions of said dielectric layer that match these opening parts; and measuring the power loss between said second vias and said first and second conductor layers by the S parameter method.

In this aspect of the present invention, a high-frequency electric power is applied directly to the second vias used for excitation, and a pure TEM (transverse electromagnetic mode) wave in which the electric field and magnetic field are perpendicular can therefore be input into the resonator. Accordingly, the complex dielectric constant can be measured with a high precision.

In this complex dielectric constant measurement method, for example, the external conductors on the second end parts of a pair of coaxial cables whose first end parts are connected to a network analyzer are connected to the first and second conductor layers, respectively, and the central conductors of the second end parts of the pair of coaxial cables are respectively inserted from both end parts of the second vias and connected to the second vias. In this way, $S_{11}$ and $S_{21}$ can be measured by the network analyzer.

The resonator may further have one or more conductor layers which are disposed between the first conductor layers and second conductor layers and are oriented parallel to the first and second conductor layers so as to sandwich the dielectric layer in between, which have opening parts formed in positions matching the first and second opening parts, and which are connected to the first vias.

Furthermore, the regions surrounded by the first vias of the resonator may be rectangular as seen in a plan view. In this case, the length of one side of the rectangular regions may be set at ($\lambda/\sqrt{2}$) or greater, where $\lambda$ is the measurement wavelength of the complex dielectric constant.

Moreover, the distance between the adjacent first vias of the resonator may be set at ($\lambda/20$) or less, where $\lambda$ is the measurement wavelength of the complex dielectric constant. In addition, the resonator may be formed in a printed board, and the complex dielectric constant of this printed board may be measured.

In the present invention, since the second vias are formed in a non-contact manner with the first and second conductor layers, the resonator constructed by the first vias and first and second conductor layers can be excited by applying high-frequency power to these second vias. Furthermore, since a plurality of first vias is disposed in the surrounding area, electrical interference with other parts can be prevented, so that the resonator can be built into a printed board, and the effective complex dielectric constant of the printed board, and the frequency of this dielectric constant, can be measured with a high precision in a frequency range extending from several gigahertzes to 20 GHz.

Figure 1A:
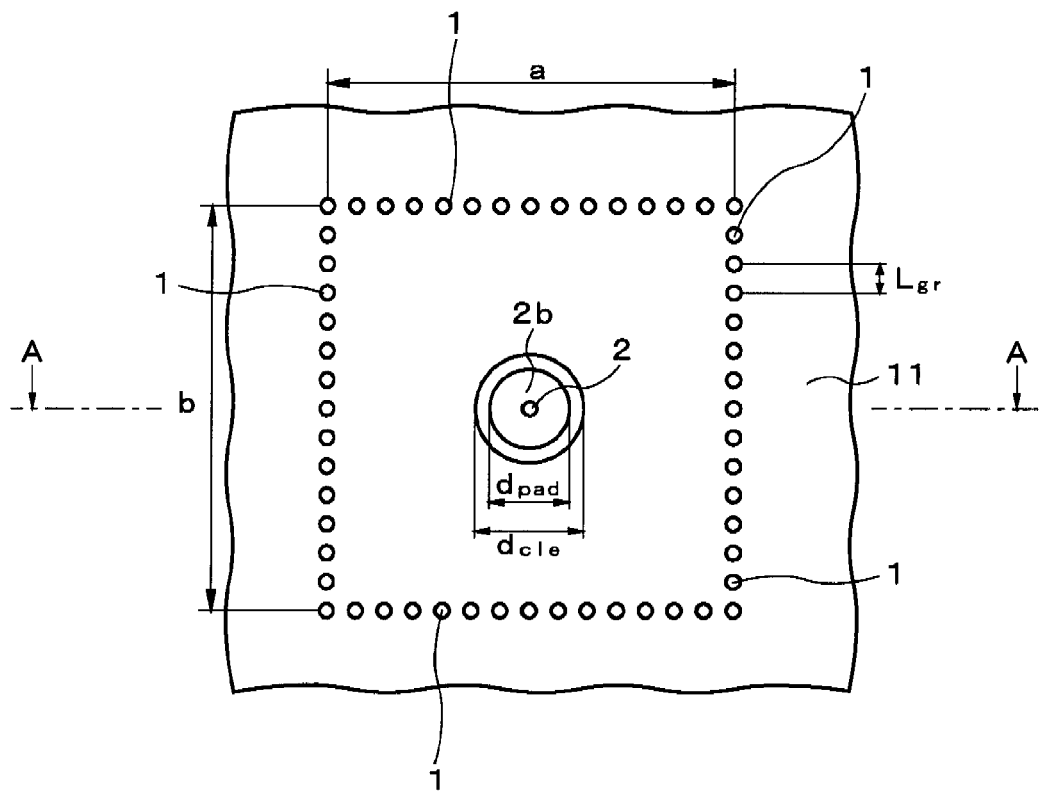
FIG. 1(a) is a plan view showing the resonator of the present embodiment.

KEY 1, 2, 42, 52, 61, 62: through-hole vias
1a, 2a: through-holes
1b, 2b, 11 through 15: conductor layers
21 through 24, 111 through 115: insulating layers
31a, 31b: coaxial cables
32a, 32b, 124: central conductors
33a, 33b: insulators
34a, 34b: outer conductors
100: high-frequency circuit
121: circuit pattern
122: internal electrode
123, 125: ground electrodes
116: side-surface electrode

BEST MODE FOR CARRYING OUT THE INVENTION

Figure 1B:
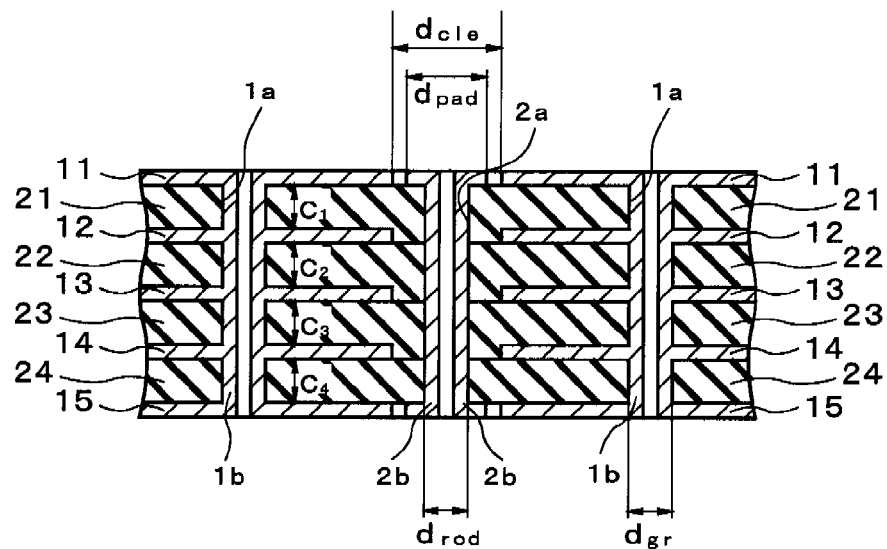
FIG. 1(b) is a sectional view along line A-A in FIG. 1(a)

Embodiments of the present invention will be described in detail below with reference to the attached figures. First, a resonator constituting Embodiment 1 of the present invention will be described. The resonator of the present embodiment is formed in a printed board having a multi-layer structure in which five conductor layers are formed via insulating layers each of which is composed of a dielectric. FIG. 1(a) is a plan view showing the resonator of the present embodiment, and FIG. 1(b) is a sectional view along line A-A in FIG. 1(a). As is shown in FIGS. 1(a) and 1(b), the resonator of the present embodiment has a rectangular shape as seen in a plan view, and a plurality of through-hole vias 1 which passes through the printed board and in which a conductor layer 1b is formed on the inside surface of a through-hole 1a having a diameter of $d_{gr}$ is formed with fixed gaps $L_{gr}$ left between these through-hole vias in the peripheral part of the resonator. These through-hole vias 1 are connected to all of the conductor layers 11 through 15.

Furthermore, opening parts having a diameter of $d_{cle}$ are formed in the central portions of the regions surrounded by the through-hole vias 1 in the conductor layers 11 through 15, and through-holes 2a having a diameter of $d_{rod}$ which pass through the printed board are formed in the central portions of these opening parts. Conductor layers 2b are formed so as to cover the inside surfaces of these through-holes 2a and the circumferences of both end parts; and through-hole vias 2 used for excitation, which are used to excite the resonator, are formed by the through-holes 2a and conductor layers 2b. In these through-hole vias 2, the diameter of the conductor layers 2b formed around the circumferences of both end parts of the through-holes 2a, i.e., the conductor layers 2b formed inside the opening parts of the conductor layer 11 and conductor layer 15, is $d_{pad}$, and the distance between the conductor layers (conductor layers 11 and 15) and through-hole vias 2 on the front surface and back surface of the printed board is ($d_{cle}-d_{pad}$). Meanwhile, in the interior of the printed board, the distance between the conductor layers (conductor layers 12 through 14) and the through-hole vias 2 is ($d_{cle}-d_{rod}$).

Furthermore, the conductor layers 11 through 15 are insulated from each other by insulating layers 21 through 24 each of which is composed of a dielectric; as a result, four cavity resonators with respective (length, width, height) values of (a, b, $c_1$), (a, b, $c_2$), (a, b, $c_3$) and (a, b, $c_4$) are formed in the direction of thickness of the printed board, where a is the lateral length of the region surrounded by the through-hole vias 1, b is the longitudinal length of the same, and $c_1$, $c_2$, $c_3$, and $c_4$ are the respective thicknesses of insulating layers 21 through 24. Furthermore, the diameter $d_{gr}$ of the through-holes 1a and the diameter of the through-holes 2a each indicate a drill diameter.

Figure 2A:
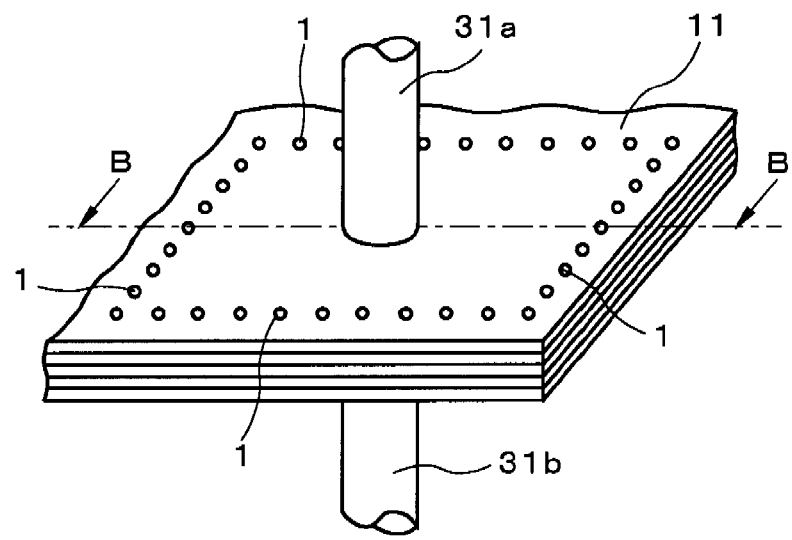
FIG. 2(a) is a sectional perspective view showing a method for measuring the complex dielectric constant of a printed board using the resonator of the present embodiment.
Figure 2B:
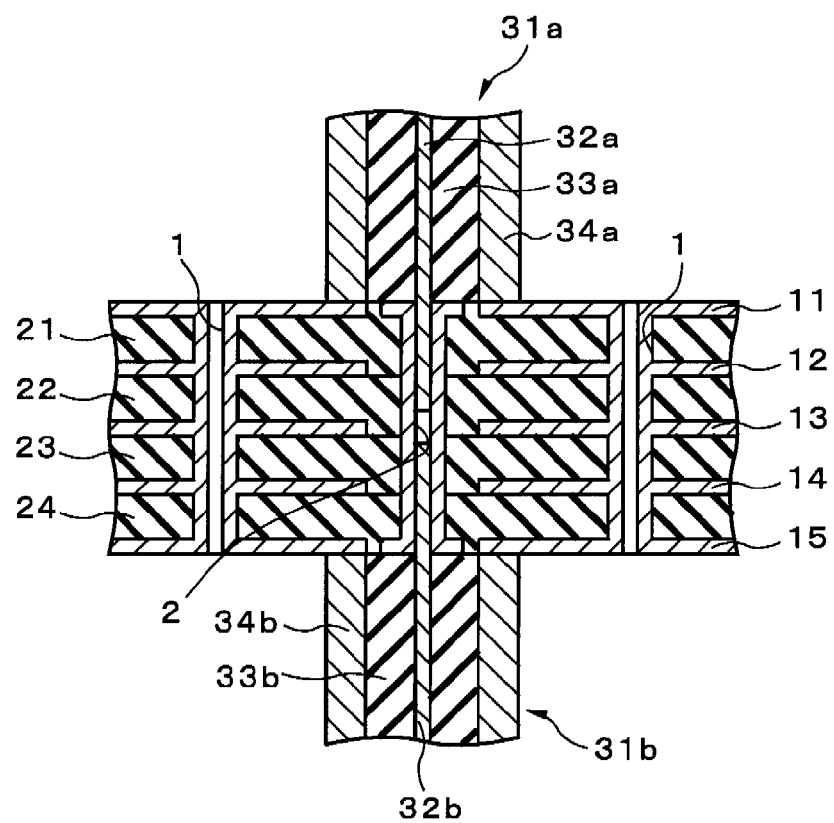
FIG. 2(b) is a sectional view along line B-B in FIG. 2(a)

Next, the operation of the resonator of the present embodiment, i.e., the complex dielectric constant measurement method using the resonator of the present invention, will be described. FIG. 2(a) is a sectional perspective view illustrating the method used to measure the complex dielectric constant of a printed board using the resonator of the present embodiment, and FIG. 2(b) is a sectional view along line B-B in FIG. 2(a). As is shown in FIGS. 2(a) and 2(b), when the complex dielectric constant of a printed board is to be measured, two coaxial cables 31a and 31b in which the central conductors protrude from one end part are first prepared. Then, the central conductor 32a of the coaxial cable 31a is inserted into one end part of the through-hole via 2, and the end part of the outer conductor 34a which is formed on the outside of this central conductor 32a via an insulator 33a is press-fitted in the conductor layer 11; furthermore, the central conductor 32b of the coaxial cable 31b is inserted into the other end part of the through-hole via 2, and the end part of the outer conductor 34b which is formed on the outside of this central conductor 32b via an insulator 33b is press-fitted in the conductor layer 15. As a result, the central conductors 32a and 32b of the coaxial cables 31a and 31b are electrically connected to the conductor layers 2a of the through-hole via 2, and the outer conductors 34a and 34b are electrically connected to the conductor layers 11 and 15, respectively. In this case, it is desirable to use coaxial cables of the semi-rigid type which have rigidity in the outer conductors 34a and 34b, and which do not readily bend, as the coaxial cables 31a and 31b.

Next, the other end parts of the coaxial cables 32a and 32b are connected to port 1 and port 2, respectively, of a network analyzer, and the power loss between the through-hole via 2 and the conductor layers 11 and 15, i.e., the power loss in the dielectric layers 21 through 24, is measured by the S parameter method. Then, on the basis of the results obtained, the complex dielectric constant of the dielectric material forming the insulating layers 21 through 24 of the printed circuit board is determined by the method described below, as is the frequency dependency of this dielectric constant. In the resonator of the present embodiment, the through-hole via 2 used for excitation and the coaxial cables 32a and 32b are directly connected, and the high-frequency power that is output from port 1 of the network analyzer and input into port 2 passes linearly through the resonator; accordingly, a pure TEM wave in which the electric field and magnetic field are perpendicular to each other can be input into the resonator. As a result, the Q value can be determined with a high precision.

Below, the method used to determine the complex dielectric constant of the insulating layers 21 through 24 and the frequency characteristics of this complex dielectric constant from the power loss measured by the method described above will be described as an example using a printed board in which the insulating layers 21 through 24 are formed from a glass epoxy FR4 material, and a resonator that is rectangular as seen in a plan view is formed. The dimensions of the resonator formed in this printed board are as follows: the lateral length a is 20 mm, the longitudinal length b is 20 mm, the gap $L_{gr}$ of the through-hole vias 1 is 0.6 mm, the diameter $d_{gr}$ of the through-holes 1a is 0.3 mm, the diameter $d_{cle}$ of the opening parts in the conductor layers 11 and 15 is 1.65 mm, the diameter $d_{pad}$ of the conductor layers 2b formed around both end parts of the through-holes 2a is 0.95 mm, the diameter $d_{rod}$ of the through-holes 2a is 0.65 mm, and the respective thicknesses of the insulating layers 21 through 24 are $c_1$=0.3 mm, $c_2$=1.25 mm, $c_3$=01.3 mm, and $c_4$=0.3 mm.

Figure 3:
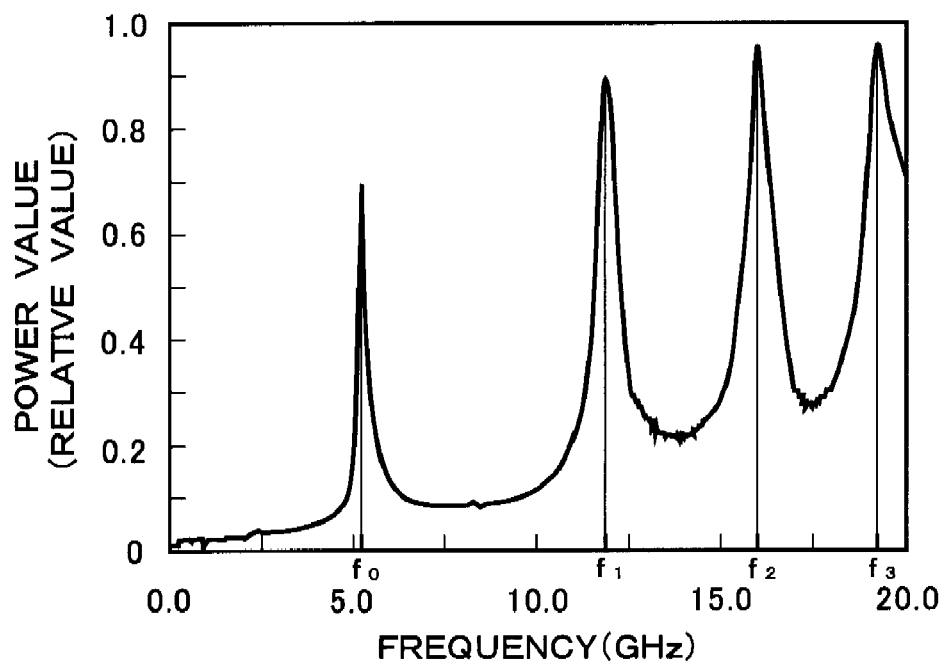
FIG. 3 is a graph showing the frequency dependency of the power loss, with the frequency plotted on the horizontal axis, and the power value plotted on the vertical axis.

FIG. 3 is a graph showing the frequency dependency of the power loss, with the frequency plotted on the horizontal axis, and the power value plotted on the vertical axis. Furthermore, the power value shown in FIG. 3 is a value that is normalized as 1.0 in a case in which there is no loss; specifically, this is a value that is determined by $(1.0-|S_{11}|^2-|S_{21}|^2)$ using $S_{11}$ and $S_{21}$ measured by a network analyzer. As is shown in FIG. 3, in this printed board, peaks appear in the power loss at frequencies of $f_0$, $f_1$, $f_2$ and $f_3$, and resonance occurs at the respective frequencies. Here, in cases in which the height of the resonator (thicknesses $c_1$ through $c_4$ of the insulating layers 21 through 24) is sufficiently small compared to the wavelength, the resonance frequency $f_{m,n}$ (m and n are integers) is expressed by the following equation 1. Furthermore, in the following equation 1, C is the velocity of light, and $\in_r$ is the specific dielectric constant.

$$f_{m,n} = \frac{C}{2 \times \sqrt{\varepsilon_r}} \times \sqrt{\left(\frac{m}{a}\right)^2 + \left(\frac{n}{b}\right)^2} \quad \text{[Equation 1]}$$

In this resonator of the present embodiment, the length of one side is set to be at least $(1/\sqrt{2})$ of the wavelength $\lambda$ $(=C/(f\times\sqrt{\in_r}))$; accordingly, m and n in the above equation 1 are always 1 or greater, and one or more resonance peaks appear. Consequently, four or more resonance peaks can be obtained in the frequency range of 0 to 20 GHz in spite of the fact that the resonator is compact, occupying an extremely small area of 20 mm length by 20 mm width.

Furthermore, the frequency $f_0$ (=5.2 GHz) of the first peak shown in FIG. 3 is for a case in which (m, n) in the above equation 1 is (1, 1). When the specific dielectric constant $\in_r$ is determined with $f_0=f_{m,n}$, a value of 4.16 is obtained. Furthermore, the frequency $f_1$ (=12 GHz) of the second peak is for a case in which (m, n)=(1, 3); here, the specific dielectric constant $\in_r$ is 4.04. Similarly, the frequency $f_2$ of the third peak corresponds to (m, n)=(3, 3), the frequency $f_3$ of the fourth peak corresponds to (m, n)=(2, 5), and the specific dielectric constants $\in_r$ can each be determined from the above equation 1. These specific dielectric constants $\in_r$ are expressed by the following equation 2.

$$\varepsilon = \frac{\varepsilon'}{\varepsilon_0} \quad \text{[Equation 2]}$$

$\in'$ in Equation 2 is the real portion of the complex dielectric constant $\in$ ($=\in'-i\in''$), and $\in_0$ is the vacuum dielectric constant. Accordingly, the real portion $\in'$ of the complex dielectric constant can be determined by determining the specific dielectric constant $\in_r$ of the printed board.

Figure 4:
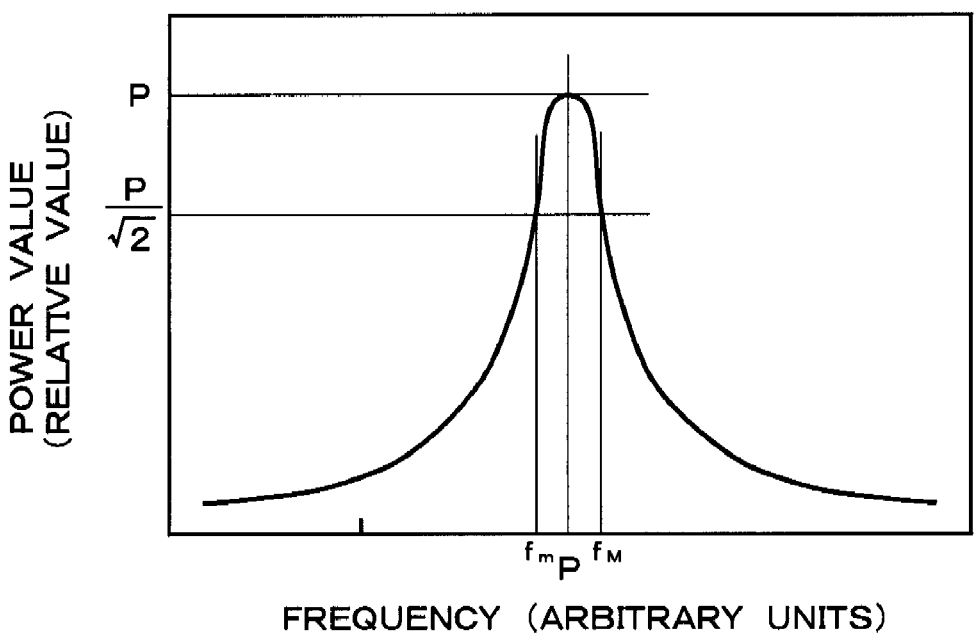
FIG. 4 is a graph showing one resonance peak, with the frequency plotted on the horizontal axis, and the power value plotted on the vertical axis.

Next, the imaginary portion $\in''$ of the complex dielectric constant $\in$ is determined. FIG. 4 is a graph showing one resonance peak, with the frequency plotted on the horizontal axis, and the power value plotted on the vertical axis. Furthermore, f shown in FIG. 4 is the frequency at which the power assumes the maximum value P, and $f_m$ and $f_M$ are the frequencies at which the power assumes the value of $(1/\sqrt{2})$ of the maximum value P. The imaginary portion $\in''$ of the complex dielectric constant $\in$ is related to the Q value of the resonance or the D value which is the reciprocal of the Q value; and the Q value of the resonance peak shown in FIG. 4 is determined by the following Equation 3.

$$D = \frac{1}{Q} = \frac{f_M - f_m}{f} = \frac{\Delta f}{f} \quad \text{[Equation 3]}$$

The Q value determined by the above Equation 3 includes both the power loss of the dielectric of the resonator (dielectric loss) and the power loss of the conductors (conduction loss), and is expressed by the following Equation 4. Furthermore, $Q_d$ in the following Equation 4 is the value originating in the dielectric loss, and $Q_c$ is the value originating in the conduction loss.

$$\frac{1}{Q} = \frac{1}{Q_d} + \frac{1}{Q_c}$$ [Equation 4]

Accordingly, when no dielectric is present, $Q=Q_c$, and an analytical formula is present depending on the shape of the resonator. For example, in the case of a resonator having a rectangular shape as seen in a plan view, $Q_c$ is given by the following Equation 5.

$$Q_c = \frac{\pi \times \eta_0}{4 \times R_s} \times \frac{2 \times c \times (a^2 + b^2)^{\frac{3}{2}}}{a \times b \times (a^2 + b^2) + 2 \times c \times (a^3 + b^3)}$$ [Equation 5]

Here, in Equation 5, a is the lateral length of the resonator, b is the longitudinal length, and c is the height (thicknesses $c_1$ through $c_4$ of the dielectric layers 21 through 24). Furthermore, $\eta_0$ is $120\pi$, and $R_s$ is the surface resistance value determined by the material of the conductor layers of the resonator and the measurement frequency f. In this case, since the conductor layers 11 through 15 are copper, the surface resistance Rs is expressed by the following Equation 6.

$$R_s = 2.61 \times 10^{-7} \times \sqrt{f}$$ [Equation 6]

Furthermore, the resonance peak shown in FIG. 4 is obtained by measurement of the S parameter. $Q_d$ originating in the power loss of the dielectric can be determined by means of the respective values of this resonance peak and the above Equations 3 through 6. The relationship between this $Q_d$ value, and the dielectric tangent $\tan \delta$ and imaginary portion $\in''$ of the complex dielectric constant $\in$ is expressed by the following Equation 7.

$$\frac{1}{Q_d} = \tan\delta = \frac{\varepsilon''}{\varepsilon'}$$ [Equation 7]

Accordingly, the imaginary portion $\in''$ of the complex dielectric constant $\in$ can be determined by determining the dielectric tangent $\tan \delta$ of the dielectric. For example, in the case of the resonance peak at the frequency $f_0$ (=5.2 GHz) shown in FIG. 3, if the reciprocal of the Q value is determined by the above Equation 3, a value of D=1/Q=0.028 is obtained. Furthermore, if the $Q_c$ values originating in the conduction loss is determined using the above Equation 5 for each of the four resonators disposed in the printed board, values of $Q_{c1}$=648, $Q_{c2}$=2472, $Q_{c3}$=648, and $Q_{c4}$=648 are obtained. In a case in which a plurality of resonators is present in the printed board, the reciprocal of the overall Q value is expressed by the sum of the reciprocals of the Q values of the respective resonators. Accordingly, the reciprocal ($1/Q_c$) of the $Q_c$ value of the printed board as a whole is determined by the following Equation 8.

$$\frac{1}{Q_c} = \frac{1}{Q_{c1}} + \frac{1}{Q_{c2}} + \frac{1}{Q_{c3}} + \frac{1}{Q_{c4}}$$ [Equation 8]
$$= \frac{1}{648} + \frac{1}{2472} + \frac{1}{648} + \frac{1}{648}$$
$$= 0.0050$$

Furthermore, when the reciprocal ($1/Q_d$) of the $Q_d$ value originating in the dielectric loss is determined using Equations 8 and 4, a value of 0.023 is obtained. Specifically, the effective dielectric tangent $\tan \delta$ of the glass epoxy FR material at 5.2 GHz is 0.023. Furthermore, the dielectric tangent $\tan \delta$ can be determined by a similar method for the other resonance peaks shown in FIG. 3.

Figure 5:
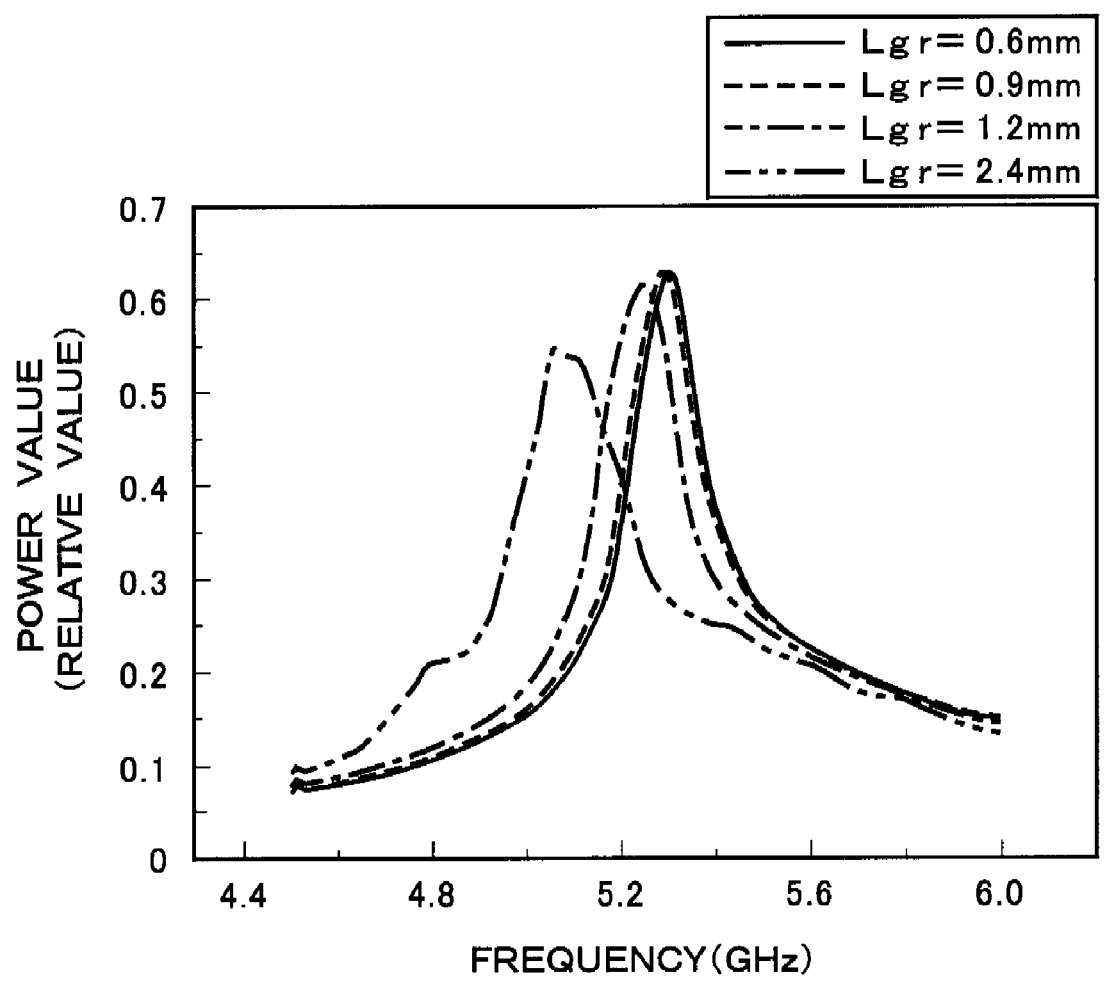
FIG. 5 is a graph showing the variation in the frequency $f_0$ at which the first resonance peak appears when the gap $L_{gr}$ of the through-hole via 1 is varied, with the frequency plotted on the horizontal axis, and the power value plotted on the vertical axis.

FIG. 5 is a graph showing the variation in the frequency $f_0$ at which the first resonance peak appears when the gap $L_{gr}$ of the through-hole vias 1 is varied, with the frequency plotted on the horizontal axis and the power value plotted on the vertical axis. As is shown in FIG. 5, when the gap $L_{gr}$ of the through-hole vias 1 disposed around the periphery of the resonator is varied, not only does the resonance frequency f move, but the Q value of the resonator also varies. Specifically, the D value which is the reciprocal of the Q value for a gap $L_{gr}$ of 0.6 mm is 0.028, the D value for a gap $L_{gr}$ of 0.9 mm is 0.028, the D value for a gap $L_{gr}$ or 1.2 mm is 0.031, and the D value for a gap $L_{gr}$ of 2.4 mm is 0.041. The reason for this is that power leaks occur between adjacent through-hole vias 1. However, when the gap $L_{gr}$ of the through-hole vias 1 is smaller than a specified value, the amount of variation is extremely small and can be ignored. Accordingly, it is desirable that the gap $L_{gr}$ of the through-hole vias 1 be set at a sufficiently small value so that power leaks can be ignored, i.e., it is desirable that this gap be set at (1/20) of the measurement wavelength $\lambda$ (=C/(f×$\sqrt{\in_r}$)).

In the resonator of this embodiment, as was described above, parallel flat-plate resonators are formed by the conductor layers 11 through 15 and the plurality of through-hole vias 1 disposed in the peripheral portions. Accordingly, there is a direct connection between the coaxial cables 31a and 31b and the through-hole vias 2 used for excitation which are disposed in the region surrounded by the plurality of through-hole vias 1, the Q value of the resonance can be determined by measuring the S parameter by means of the network analyzer, and the complex dielectric constant of the dielectrics that constitute the printed board as a whole can be determined from this Q value. This resonator utilizes a portion of the area of the multi-layer printed board, and can be built into the board as a test coupon for the actual device. Accordingly, there is no need for a special tool used to measure the complex dielectric constant; furthermore, the complex dielectric constant of the printed board of an actual device can be measured with a high precision. Furthermore, in cases in which the shape of the resonator is rectangular as seen in a plan view, a size of approximately 20 mm on one side is sufficient when measurements are performed in a frequency range of up to 20 GHz, and the resonator is extremely compact. Furthermore, in cases in which the measurement frequency exceeds 20 GHz, the resonator can be made even more compact.

Figure 6:
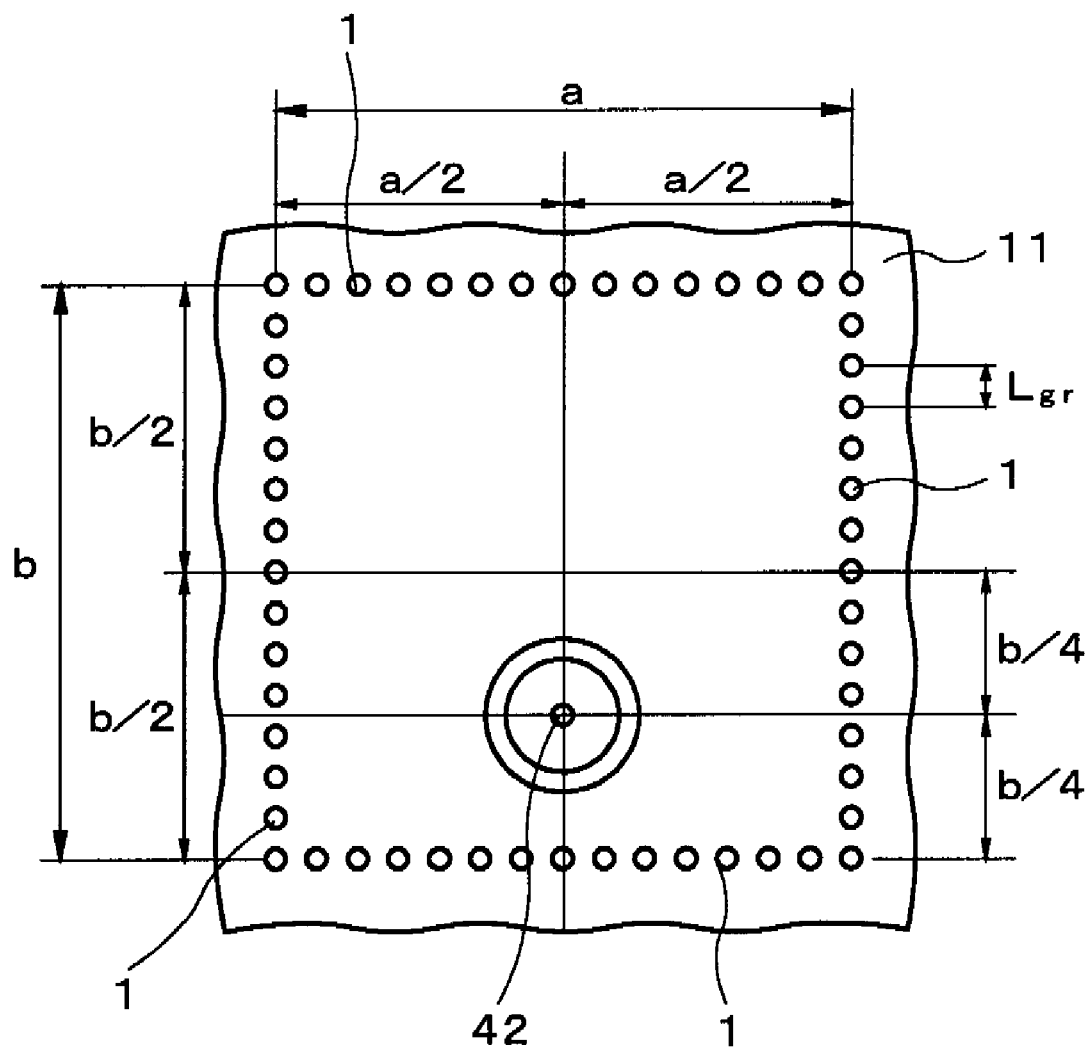
FIG. 6 is a plan view showing a resonator constituting Embodiment 2 of the present invention.

Next, a resonator constituting Embodiment 2 of the present invention will be described. In the resonator of Embodiment 1 described above, through-hole vias 2 used for excitation are disposed in the central portion of a region surrounded by a plurality of through-hole vias 1. However, the present invention is not limited to this. These through-hole vias 2 may be formed in areas other than the central portion. FIG. 6 is a plan view showing the resonator of the present embodiment. Furthermore, in FIG. 6, elements that are the same as constituent elements of the resonator of Embodiment 1 shown in FIG. 1 are labeled with the same symbols, and a detailed description of such elements is omitted. In the resonator of the present embodiment, as is shown in FIG. 6, through-hole vias 42 used for excitation are formed in positions that are shifted by (b/4) from the center of the region surrounded by the through-hole vias 1.

In the resonator of the present embodiment, higher-order resonance modes are easily excited, and more resonance peaks are obtained than in the resonator of Embodiment 1 shown in FIG. 1. Specifically, the four resonance peaks shown in FIG. 3 are generated in the resonator of embodiment 1 in the frequency region up to 20 GHz. In the resonator of the present embodiment, however, six resonance peaks are generated. As a result, the resonator of the present embodiment makes it possible to obtain more points for determining the frequency dependency of the complex dielectric constant than the resonator of embodiment 1. Furthermore, the constructions and effects other than those described above in the resonator of the present embodiment are similar to those of the resonator of embodiment 1. Moreover, the operation, i.e., the method used to measure the complex dielectric constant using the resonator of the present embodiment, is also similar to that used in the resonator of Embodiment 1.

Figure 7:
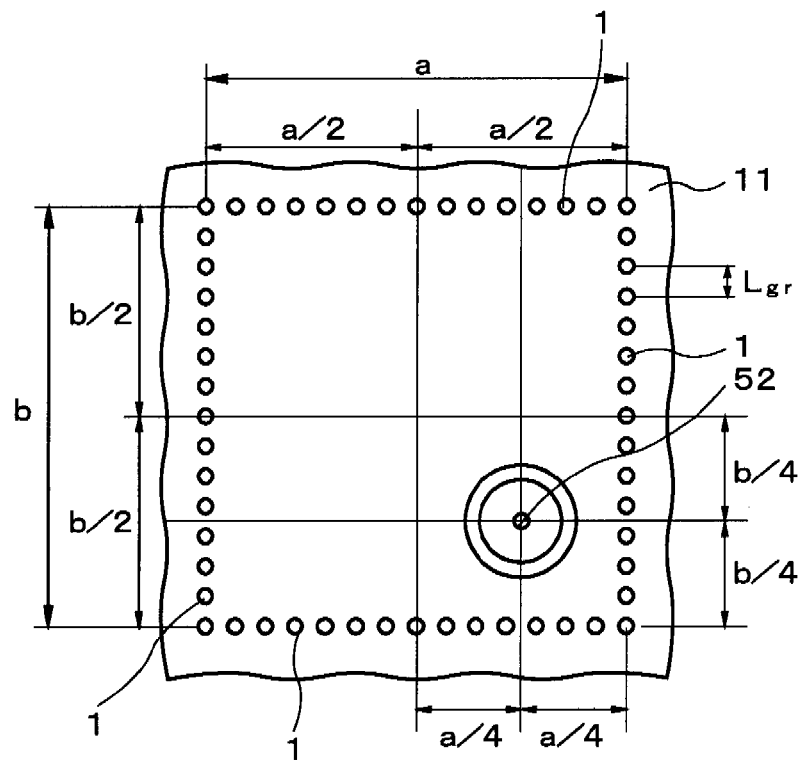
FIG. 7 is a plan view showing a resonator constituting a modification of Embodiment 2 of the present invention.

Next, a resonator constituting a modification of Embodiment 2 of the present invention will be described. FIG. 7 is a plan view showing the resonator of this modification. Furthermore, in FIG. 7, elements that are the same as constituent elements of the resonator of Embodiment 1 shown in FIG. 1 are labeled with the same symbols, and a detailed description of such elements is omitted. In the resonator of Embodiment 2 shown in FIG. 6, the through-hole vias 42 used for excitation are shifted only in the longitudinal direction from the center of the region surrounded by the through-hole vias 1; however, in the resonator of the present modification, as is shown in FIG. 7, these vias are shifted in both the longitudinal direction and lateral direction. Specifically, the through-hole vias 52 used for excitation are formed in positions that are shifted by (b/4) in the longitudinal direction and (a/4) in the lateral direction from the center of the region surrounded by the through-hole vias 1.

In the resonator of the present modification, since the through-hole vias 52 used for excitation are formed in positions that are shifted in both the longitudinal direction and lateral direction from the center of the region surrounded by the through-hole vias 1, higher-order resonance modes are more easily excited than in a case in which these positions are shifted in only one direction, i.e., either the longitudinal direction or lateral direction. Specifically, seven resonance peaks are obtained in the frequency range up to 20 GHz. As a result, more points for determining the frequency dependency of the complex dielectric constant can be obtained than in the resonators of Embodiments 1 and 2. Furthermore, constructions and effects other than those described above in the resonator of the present modification are similar to those of the resonator of Embodiment 2. Moreover, the operation, i.e., the method used to measure the complex dielectric constant using the resonator of the present embodiment, is also similar to that used in the resonator of Embodiment 2.

Figure 8:
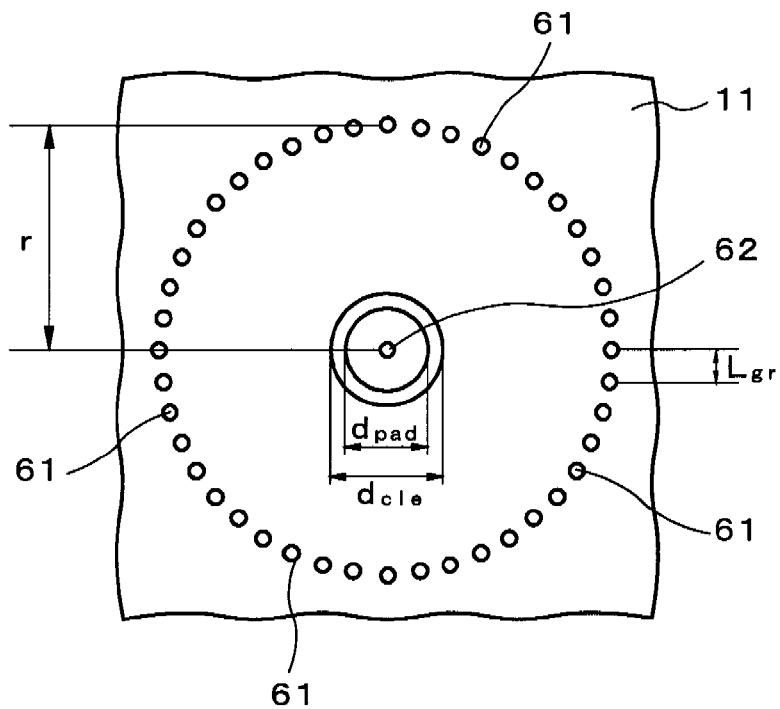
FIG. 8 is a plan view showing a resonator constituting Embodiment 3 of the present invention.
Figure 9:
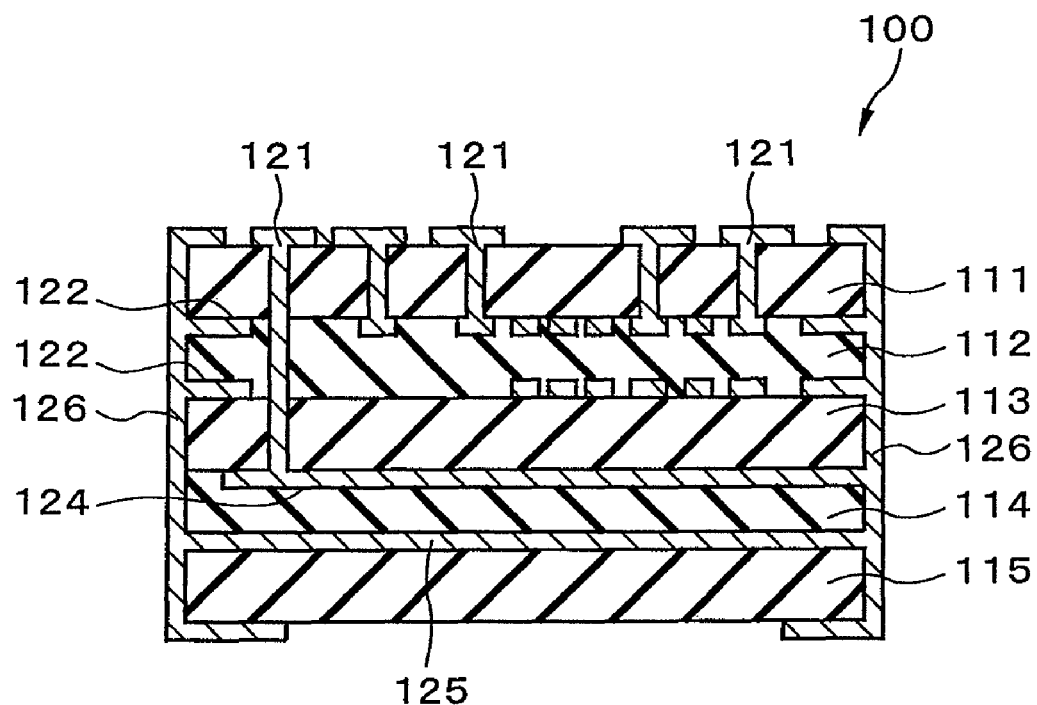
FIG. 9 is a schematic sectional view showing the construction of the high-frequency circuit described in patent document 10.

Next, a resonator constituting Embodiment 3 of the present invention will be described. In the resonators of Embodiments 1 and 2 and the modification of Embodiment 2, the shape of the resonator is rectangular as seen in a plan view. However, the present invention is not limited to this. A polygonal shape, round shape, or elliptical shape may also be used. FIG. 8 is a plan view showing the resonator of the present embodiment. Furthermore, in FIG. 8, elements that are the same as constituent elements of the resonator of Embodiment 1 shown in FIG. 1 are labeled with the same symbols, and a detailed description of such elements is omitted. In the resonator of the present embodiment, as is shown in FIG. 8, the shape of the resonator is a circular shape, and a plurality of through-hole vias 61 is formed around the periphery. Furthermore, through-hole vias 62 used for excitation are formed in the central portion of the circular region as seen in a plan view which is surrounded by the plurality of through-hole vias 61.

In the resonator of the present embodiment as well, a plurality of resonances is generated in the same manner as in the resonator having a rectangular shape as seen in a plan view. Furthermore, the resonance frequency can be expressed by a simple equation that includes a root of the Bessel function, and the complex dielectric constant can be measured by the same method as in the resonator of embodiment 1. Furthermore, constructions and effects other than those described above in the resonator of the present embodiment are similar to those of the resonator of Embodiment 1.

INDUSTRIAL APPLICABILITY

The present invention is advantageous for providing a resonator that is used to measure the complex dielectric constant of a dielectric and the frequency characteristics of this complex dielectric constant, a printed board equipped with this resonator, and a method for measuring the complex dielectric constant using this resonator.

The invention claimed is:

1. A resonator for measuring a complex dielectric constant which measures the complex dielectric constant of a dielectric layer, said resonator for measuring a complex dielectric constant comprising:
   first and second conductor layers disposed parallel to each other so as to sandwich said dielectric layer in between;
   a first opening part formed in said first conductor layer and a second opening part formed in said second conductor layer, said second opening part facing said first opening part;
   a plurality of first through-hole vias which are disposed, forming a loop around said first and second opening parts when viewed from a direction perpendicular to a surface of said dielectric layer, with gaps left in between, wherein each gap is a distance between adjacent first through-hole vias, and wherein said first through-hole vias connect said first and second conductor layers to each other; and
   second through-hole vias formed, without being in contact with said first and second conductor layers, in said first and second opening parts and in regions of said dielectric layer corresponding to said first and second opening parts.

2. The resonator for measuring a complex dielectric constant according to claim 1, further comprising one or more conductor layers which are disposed parallel to each other between said first and second conductor layers so as to sandwich said dielectric layer in between, wherein said one or more conductor layers have opening parts formed therein corresponding to said first and second opening parts, and which are connected to said first through-hole vias.

3. The resonator for measuring a complex dielectric constant according to claim 1 or claim 2, wherein the region surrounded by said first through-hole vias has a rectangular shape as seen in a plan view.

4. The resonator for measuring a complex dielectric constant according to claim 3, wherein the length of one side of said rectangular region is ($\lambda/\sqrt{2}$) or greater, where $\lambda$ is the measurement wavelength of the complex dielectric constant.

5. The resonator for measuring a complex dielectric constant according to claim 1 or 2, wherein the distance between adjacent first through-hole vias is ($\lambda/20$) or less, where $\lambda$ is the measurement wavelength of the complex dielectric constant.

6. A printed board in which a plurality of conductor layers is insulated from each other by dielectric layers, said printed board comprising the resonator according to claim 1 or 2.

7. A method for measuring the complex dielectric constant of a dielectric layer, said method for measuring a complex dielectric constant comprising the steps of:
applying a high-frequency electric power to second through-hole vias of a resonator, said resonator having
first and second conductor layers disposed parallel to each other so as to sandwich said dielectric layer in between,
a first opening part formed in said first conductor layer and a second opening part formed in said second conductor layer, said second opening part facing said first opening part,
a plurality of first through-hole vias which are disposed, forming a loop around said first and second opening parts when viewed from a direction perpendicular to a surface of said dielectric layer, with gaps left in between, wherein each gap is a distance between adjacent first through-hole vias, and wherein said first through-hole vias connect said first and second conductor layers to each other, and
said second through-hole vias formed, without being in contact with said first and second conductor layers, in said first and second opening parts and in regions of said dielectric layer corresponding to said first and second opening parts; and
measuring the power loss between said second vias and said first and second conductor layers by the S parameter method.

8. The method for measuring a complex dielectric constant according to claim 7, wherein the measurement of the power loss is accomplished by a process in which external conductors on second end parts of a pair of coaxial cables whose first end parts are connected to a network analyzer are respectively connected to said first and second conductor layers, the central conductors of the second end parts of the pair of coaxial cables are respectively inserted from both end parts of said second through-hole vias and connected to said second through-hole vias, and $S_{11}$ and $S_{21}$ are measured by said network analyzer.

9. The method for measuring a complex dielectric constant according to claim 7 or 8, wherein said resonator further has one or more conductor layers which are disposed parallel to said first and second conductor layers so as to sandwich said dielectric layer between said first and second conductor layers, wherein said one or more conductor layers have opening parts formed in positions corresponding to said first and second opening parts, and which are connected to said first through-hole vias.

10. The method for measuring a complex dielectric constant according to claim 7 or 8, wherein the region surrounded by said first through-hole vias of said resonator has a rectangular shape as seen in a plan view.

11. The method for measuring a complex dielectric constant according to claim 10, wherein the length of one side of said rectangular region is ($\lambda/\sqrt{2}$) or greater, where $\lambda$ is the measurement wavelength of the complex dielectric constant.

12. The method for measuring a complex dielectric constant according to claim 7 or 8, wherein the distance between adjacent first through-hole vias of said resonator is ($\lambda/20$) or less, where $\lambda$ is the measurement wavelength of the complex dielectric constant.

13. The method for measuring a complex dielectric constant according to claim 7 or 8, wherein said resonator is formed inside a printed board, and is used to measure the complex dielectric constant of said printed board.

\* \* \* \* \*